United States Patent
Naka et al.

(10) Patent No.: US 12,114,521 B2
(45) Date of Patent: Oct. 8, 2024

(54) LIGHT-EMITTING ELEMENT AND DISPLAY DEVICE

(71) Applicant: SHARP KABUSHIKI KAISHA, Osaka (JP)

(72) Inventors: Takayuki Naka, Osaka (JP); Yoshihiro Ueta, Osaka (JP); Noboru Iwata, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 512 days.

(21) Appl. No.: 17/434,348

(22) PCT Filed: Mar. 4, 2019

(86) PCT No.: PCT/JP2019/008469
§ 371 (c)(1),
(2) Date: Aug. 26, 2021

(87) PCT Pub. No.: WO2020/178963
PCT Pub. Date: Sep. 10, 2020

(65) Prior Publication Data
US 2022/0158115 A1 May 19, 2022

(51) Int. Cl.
*H10K 50/17* (2023.01)
*H10K 50/11* (2023.01)
*H10K 59/35* (2023.01)
*H10K 85/10* (2023.01)
*H10K 50/115* (2023.01)
*H10K 50/16* (2023.01)
*H10K 59/12* (2023.01)
*H10K 101/40* (2023.01)
*H10K 102/00* (2023.01)

(52) U.S. Cl.
CPC ............ *H10K 50/17* (2023.02); *H10K 50/11* (2023.02); *H10K 59/35* (2023.02); *H10K 85/115* (2023.02); *H10K 85/141* (2023.02); *H10K 85/146* (2023.02); *H10K 50/115* (2023.02); *H10K 50/16* (2023.02); *H10K 59/12* (2023.02); *H10K 2101/40* (2023.02); *H10K 2102/00* (2023.02); *H10K 2102/331* (2023.02); *H10K 2102/351* (2023.02)

(58) Field of Classification Search
None
See application file for complete search history.

(56) References Cited

U.S. PATENT DOCUMENTS

2007/0194694 A1\* 8/2007 Reddy ............... B82Y 30/00
428/323
2008/0309234 A1 12/2008 Cho et al.
(Continued)

FOREIGN PATENT DOCUMENTS

JP   2009-527876 A   7/2009
WO  WO-2020142482 A1 \* 7/2020 ......... H01L 33/0083

*Primary Examiner* — Michael Lebentritt
(74) *Attorney, Agent, or Firm* — ScienBiziP, P.C.

(57) ABSTRACT

A light-emitting element is provided with an anode, a light-emitting layer including quantum dots, and a cathode. The light-emitting element includes: an electron transport layer provided between the cathode and the light-emitting layer; and a hole tunneling insulating layer provided between the anode and the light-emitting layer and in contact with the anode and the light-emitting layer.

25 Claims, 12 Drawing Sheets

(56) References Cited

U.S. PATENT DOCUMENTS

| | | | |
|---|---|---|---|
| 2010/0320442 A1* | 12/2010 | Reddy | B82Y 30/00 |
| | | | 977/774 |
| 2013/0020550 A1 | 1/2013 | Reddy | |
| 2016/0201881 A1 | 7/2016 | Brown et al. | |

* cited by examiner

| MATERIAL | ELECTRON AFFINITY [eV] | IONIZATION POTENTIAL [eV] | BAND GAP [eV] |
|---|---|---|---|
| SiON | 0.6 | 4.6 | 4 |
| $SiO_2$ | 0.95 | 9.75 | 8.8 |
| $Al_2O_3$ | 1.6 | 9.6 | 8 |
| SiN | 2.5 | 7.7 | 5.2 |
| PVK | 2.2 | 5.8 | 3.6 |
| TFB | 2.4 | 5.4 | 3 |
| PMMA | 2.6 | 5.8 | 3.2 |

FIG. 11

LIGHT-EMITTING ELEMENT AND DISPLAY DEVICE

TECHNICAL FIELD

The disclosure relates to a light-emitting element and a display device including the light-emitting element.

BACKGROUND ART

In recent years, various display devices have been developed and in particular, a display device including a quantum dot light emitting diode (QLED) has drawn a great deal of attention because the device is capable of achieving lower power consumption, smaller thickness, higher picture quality, and the like.

A light-emitting element including an anode, a light-emitting layer including quantum dots, and a cathode provided in such a display device is generally provided with a hole transport layer configured to transport holes injected from the anode to the light-emitting layer including quantum dots; however, control of an interface between the hole transport layer and a layer adjacent thereto, and selection of a layer adjacent to the hole transport layer are required, which complicates a step of forming the hole transport layer. In addition, when a conductive hole transport layer is used, holes are trapped at an interface between the conductive hole transport layer and the anode adjacent thereto and at an interface between the conductive hole transport layer and the light-emitting layer adjacent thereto to generate a non-light-emitting center, which is problematic.

PTL 1 describes a configuration of a light-emitting element provided with an insulating layer instead of each of the hole transport layer and an electron transport layer.

CITATION LIST

Patent Literature

PTL 1: US 2008/0309234 A1 (published on Dec. 18, 2008)

SUMMARY

Technical Problem

However, in a case of a light-emitting element provided with two insulating layers described in PTL 1, there is a problem in that its drive voltage is high. This is because, in a configuration in which there are two insulating layers, a voltage applied to the light-emitting element is distributed to the two insulating layers substantially evenly, and thus, an element voltage must be increased to reduce a tunnel barrier of each of the insulating layers.

Furthermore, in a case of an insulating layer provided in place of the hole transport layer, unless its energy level or film thickness is properly selected, only low light-emitting characteristics are obtained, whereas in the case of the light-emitting element described in PTL 1, the energy level and the film thickness of the insulating layer are optimized for AC driving because light is emitted by AC driving, so that the light-emitting characteristics of the light-emitting element are not satisfactory.

The disclosure is made in view of the above problems and is directed to providing a light-emitting element having a low drive voltage and high light-emitting characteristics, and a display device including the light-emitting element.

Solution to Problem

In order to solve the above problems, the light-emitting element according to an aspect of the disclosure is a light-emitting element provided with an anode, a light-emitting layer including quantum dots, and a cathode, the light-emitting element including:
  an electron transport layer provided between the cathode and the light-emitting layer; and
  a hole tunneling insulating layer provided between the anode and the light-emitting layer and in contact with the anode and the light-emitting layer.

A display device according to an aspect of the disclosure includes the light-emitting element in order to solve the above problems.

Advantageous Effects of Disclosure

It is possible to provide a light-emitting element having a low drive voltage and high light-emitting characteristics and a display device including the light-emitting element.

BRIEF DESCRIPTION OF DRAWINGS

FIG. 11 is a diagram showing an example of a material that can be used as a hole tunneling insulating layer, and shows electron affinity values, ionization potential values, and band gap values of materials.

DESCRIPTION OF EMBODIMENTS

Figure 1:
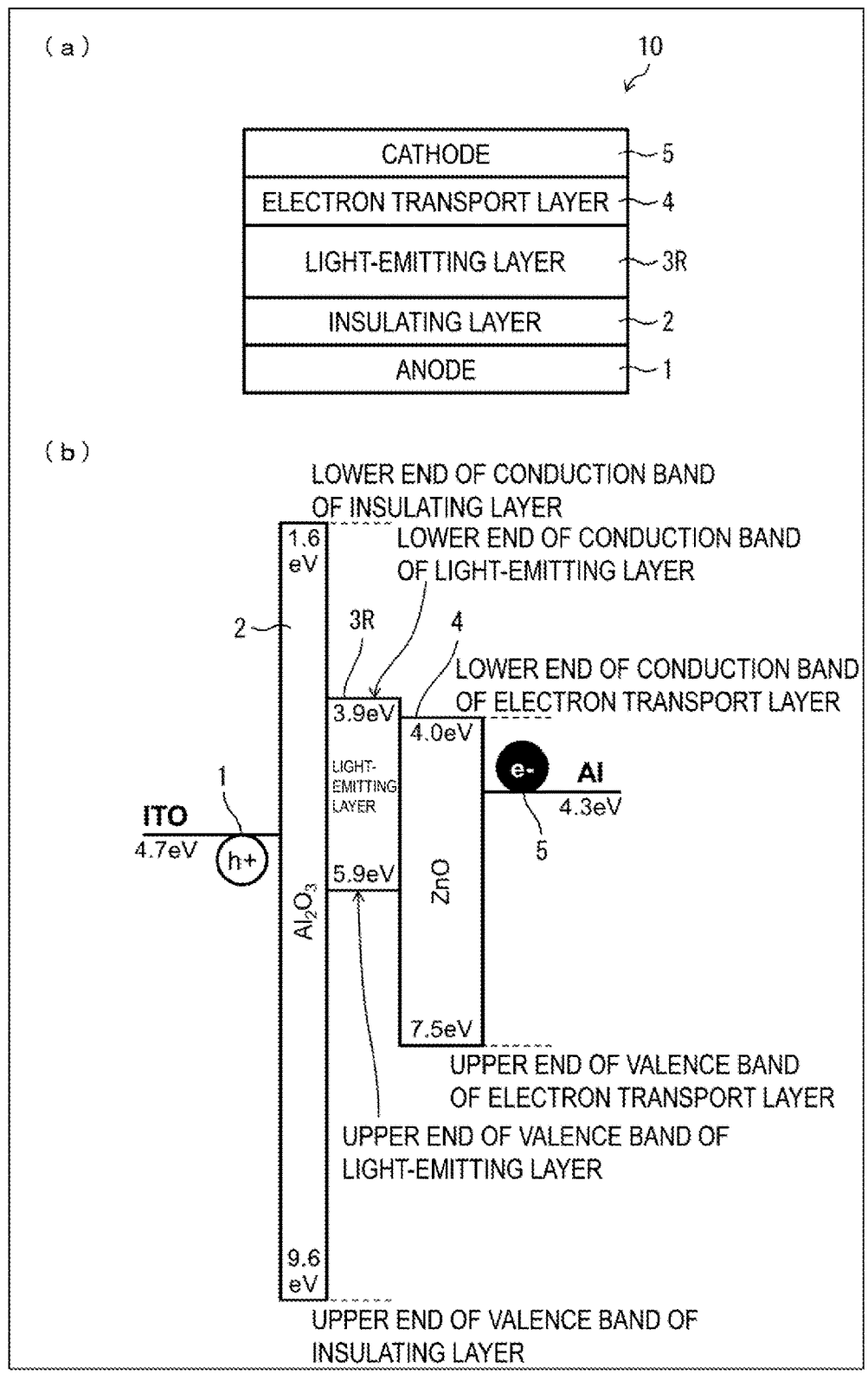
FIG. 1(a) is a diagram illustrating a schematic configuration of a light-emitting element according to a first embodiment.
FIG. 1(b) is an energy band diagram of the light-emitting element according to the first embodiment.

Embodiments of the disclosure will be described below with reference to FIGS. 1 to 5, FIGS. 9 to 12, and FIGS. 6 to 8 illustrating Comparative Examples. Hereinafter, for convenience of description, components having the same functions as those described in a specific embodiment are denoted by the same reference numerals, and descriptions thereof may be omitted.

First Embodiment (a) of FIG. 1 is a diagram illustrating a schematic configuration of a light-emitting element 10 according to a first embodiment, and (b) of FIG. 1 is an energy band diagram of the light-emitting element 10 according to the first embodiment.

As illustrated in (a) of FIG. 1, the light-emitting element 10 (first light-emitting element) includes an anode 1, a light-emitting layer 3R including quantum dots, and a cathode 5. Furthermore, the light-emitting element 10 includes an electron transport layer 4 (first electron transport layer) between the cathode 5 and the light-emitting layer 3R (first light-emitting layer). In addition, the light-emitting element 10 includes a hole tunneling insulating layer 2 (first hole tunneling insulating layer) between the anode 1 and the light-emitting layer 3R and in contact with the anode 1 and the light-emitting layer 3R.

In (a) of FIG. 1 and (b) of FIG. 1, the hole tunneling insulating layer 2, which is illustrated simply as an insulating layer, is provided between the anode 1 and the light-emitting layer 3R, and is in contact with both the anode 1 and the light-emitting layer 3R.

On the other hand, in the present embodiment, a description is given taking, as an example, a case in which the electron transport layer 4 is provided between the cathode 5 and the light-emitting layer 3R and is in contact with both the cathode 5 and the light-emitting layer 3R, but the disclosure is not limited thereto, and as long as the electron transport layer 4 is provided between the cathode 5 and the light-emitting layer 3R, the electron transport layer 4 need not be in contact with both the cathode 5 and the light-emitting layer 3R, and may be in contact with only one of the cathode 5 and the light-emitting layer 3R.

Indium tin oxide (ITO), indium zinc oxide (IZO), or the like may be used as the anode 1. Alternatively, silver nanowire, graphene, an alloy containing magnesium and silver, and. like may be used. In the present embo nent, ITO was used as the anode 1.

As the cathode 5, for example, Al, Cu, Au, Ag, or the like may be used. Alternatively, metal such as Al or Ag and a conductive material having high transmittance such as ITO may be laminated. In the present embodiment, Al was used as the cathode 5.

The light-emitting layer 3R is a light-emitting layer including quantum dots (nanoparticles), any one of CdSe/CdS, CdSe/ZnS, InP/ZnS, ZnTe—ZnSe/ZnS, ZnTe—ZnS/ZnS, CIGS/ZnS, ZnSe, and InP may be used as the quantum dots, for example, and a particle size of each of the quantum dots is about 2 to 10 nm, for example.

The light-emitting element 10 is a light-emitting element configured to emit red light, and the light-emitting layer 3R included in the light-emitting element 10 has an emission peak wavelength in a wavelength region of red light. In the present embodiment, by appropriately selecting a type of the above-described quantum dots such that the emission peak wavelength thereof is in the wavelength region of red light, and appropriately adjusting a magnitude of a particle size of each of the quantum dots, the light-emitting layer 3R having a lower end of a conduction band of the light-emitting layer 3R, that is, an electron affinity value of 3.9 eV, and an upper end of a valence band of the light-emitting layer 3R, that is, an ionization potential value of 5.9 eV was formed, as illustrated in (b) of FIG. 1. Note that as long as a difference between the lower end of the conduction band of the light-emitting layer 3R and the upper end of the valence band of the light-emitting layer 3R (difference in the band gap), that is, the emission peak wavelength of the light-emitting layer 3R is in the wavelength region of red light, the electron affinity value and the ionization potential value are not limited to the values described above.

Note that an electron affinity value means a difference between an energy level of a lower end of a conduction band of a corresponding layer and a vacuum level (0 eV), and an ionization potential value means a difference between an energy level of an upper end of a valence band of a corresponding layer and the vacuum level (0 eV).

The hole tunneling insulating layer 2 is an insulating layer that transports holes injected from the anode 1 to the light-emitting layer 3R by tunneling, that is, quantum tunneling effect. The hole tunneling insulating layer 2 may be composed of an inorganic material or may be composed of an organic material. Furthermore, the hole tunneling insulating layer 2 may be constituted by a plurality of layers composed of different materials, and may be constituted by two layers, for example, a layer composed of an inorganic material and a layer composed of an organic material. When the hole tunneling insulating layer 2 is composed of an inorganic material, the hole tunneling insulating layer 2 may include any one of aluminum oxide, silicon oxide, silicon oxynitride, and silicon nitride. Furthermore, when the hole tunneling insulating layer 2 is composed of an organic material, the hole tunneling insulating layer 2 may include any one of polymethyl methacrylate (PMMA), polyvinyl carbazole (PVK), and poly[(9,9-dioctylfluorenyl-2,7-diyl)-co-(4,4'-(N-(4-sec-butylphenyl))diphenylamine)] (TFB).

Here, a mechanism for injecting holes from the anode 1 to the hole tunneling insulating layer 2 will be described. In injecting holes from the anode 1 to the hole tunneling insulating layer 2, an electric double layer is formed at a bonded interface between the hole tunneling insulating layer 2 and the anode 1, and as a result, the vacuum level is shifted to increase an effective barrier, but the barrier thickness is reduced, whereby hole injection is achieved by a tunneling effect.

In a typical organic EL element or the like, a structure in which a conductive organic compound is used as a hole transport layer is used, and in such an organic EL element, holes are transported using a fact that electric current flowing through the conductive organic compound exhibits space charge limiting characteristics.

On the other hand, the hole tunneling insulating layer 2 described above actively utilizes the tunneling effect rather than the space charge limiting characteristics, and as described above, the thickness of the effective barrier is reduced to improve a tunneling probability. The thickness of the effective barrier can be made smaller by increasing an accumulated charge density of the electric double layer to expand the shift of the vacuum level, and thus, it is desirable for the hole tunneling insulating layer 2 to have a property with which charges are likely to be accumulated when bonding is formed with the anode 1. The anode 1 has high mobility and holes are easily moved therein, so that when a material having small mobility like the hole tunneling insulating layer 2 and the anode 1 form bonding, it is possible to accumulate charges at a high density at the bonded interface where the mobility changes greatly in a staircase manner, thereby increasing an amount of shift from the vacuum level. A material having small mobility can be used as the hole tunneling insulating layer 2, and for example, TFB or PVT(that exhibits extremely small mobility from $10^{-6}$ to $10^{-8}$ times or less relative to that of the anode 1 may be used. Note that when a film thickness of TFB or PVK is made relatively large, for example, 30 nm or greater, transport of holes by the tunneling effect cannot be achieved, and transport of holes by the space charge limiting characteristics can be achieved.

While a description has been given taking the hole tunneling insulating layer 2 (first hole tunneling insulating layer) as an example here, a hole tunneling insulating layer 12 (second hole tunneling insulating layer) and a hole tunneling insulating layer 22 (third hole tunneling insulating layer) also have a mechanism for injecting holes similar to that of the hole tunneling insulating layer 2.

Note that silicon oxynitride, silicon oxide, or aluminum oxide is preferably used as the hole tunneling insulating layer 2 for the light-emitting layer 3R, and in the present embodiment, aluminum oxide ($Al_2O_3$) was used as the hole tunneling insulating layer 2. Furthermore, in the present embodiment, aluminum oxide ($Al_2O_3$) as the hole tunneling insulating layer 2 was formed by the atomic layer deposition process (ALD) to form the hole tunneling insulating layer 2 having the lower end of the conduction band of the hole tunneling insulating layer 2, that is, an electron affinity value of 1.6 eV and the upper end of the valence band of the hole tunneling insulating layer 2, that is, an ionization potential value of 9.6 eV, as illustrated in (b) of FIG. 1. In the present embodiment, a description is given taking, as an example, a case in which the hole tunneling insulating layer is formed by the atomic layer deposition process (ALD) or sputtering (sputter film deposition), whereas the disclosure is not limited thereto, and as long as predetermined characteristics as the above-described hole tunneling insulating layer are satisfied, the hole tunneling insulating layer may be formed by a method other than the atomic layer deposition process (ALD) or sputtering (sputter film deposition).

In the present embodiment, on the ground that when the film thickness of the hole tunneling insulating layer 2 is less than 0.1 nm, film formation is difficult, and when the film thickness of the hole tunneling insulating layer 2 is greater than 2.2 nm, a probability that tunneling of holes occurs is low, the hole tunneling insulating layer 2 was formed to have a film thickness of 0.5 nm, whereas the film thickness is not particularly limited as long as tunneling of holes occurs.

Furthermore, in the present embodiment, as illustrated in (b) of FIG. 1, the electron affinity value (1.6 eV) of the hole tunneling insulating layer 2 is smaller than the electron affinity value (3.9 eV) of the light-emitting layer 3R by 2.3 eV, but the disclosure is not limited thereto. From the perspective of suppressing overflow of electrons from the light-emitting layer 3R to the anode 1, the electron affinity value of the hole tunneling insulating layer 2 is preferably smaller than the electron affinity value of the light-emitting layer 3R by 0.5 eV or greater.

In addition, in the present embodiment, the ionization potential value (9.6 eV) of the hole tunneling insulating layer 2 is greater than a value (5.4 eV) obtained by subtracting 0.5 eV from the ionization potential value (5.9 eV) of the light-emitting layer 3R, but the present invention is not limited thereto.

As described above, as long as tunneling of holes occurs, the film thickness, the electron affinity value, and the ionization potential value of the hole tunneling insulating layer 2 are not particularly limited.

Note that, from the perspective of ensuring insulation, the band gap of the hole tunneling insulating layer 2 is preferably 3 eV or greater, and in the present embodiment, aluminum oxide ($Al_2O_3$) having a band gap of 8 eV formed by the atomic layer deposition process (ALD) was used as the hole tunneling insulating layer 2.

In the present embodiment, a layer including any one of zinc oxide, titanium oxide, and magnesium zinc oxide is preferably used as the electron transport layer 4, and zinc oxide (ZnO) was used as the electron transport layer 4. As illustrated in (b) of FIG. 1, zinc oxide (ZnO) as the electron transport layer 4 has the lower end of the conduction band, that is, an electron affinity value of 4.0 eV, and the upper end of the valence hand, that is, an ionization potential value of 7.5 eV. Accordingly, the difference between the electron affinity value (4.0 eV) of the electron transport layer 4 and the electron affinity value (3.9 eV) of the light-emitting layer 3R is less than 0.5 eV, which is small, so that electrons injected to the electron transport layer 4 from the cathode 5 are transported to the light-emitting layer 3R without energy harrier. Furthermore, the difference between the ionization potential value (7.5 eV) of the electron transport layer 4 and the ionization potential value (5.9 eV) of the light-emitting layer 3R is 0.5 eV or greater, which is large, so that overflow of holes from the light-emitting layer 3R to the cathode 5 can he suppressed.

The film thickness of the electron transport layer 4 is preferably 20 to 150 nm, and in the present embodiment, the electron transport layer 4 was formed to have a film thickness of 50 nm.

Note that the electron transport layer 4 may be formed of nanoparticles, and in the present embodiment, the electron transport layer 4 was formed of zinc oxide nanoparticles.

Figure 2:
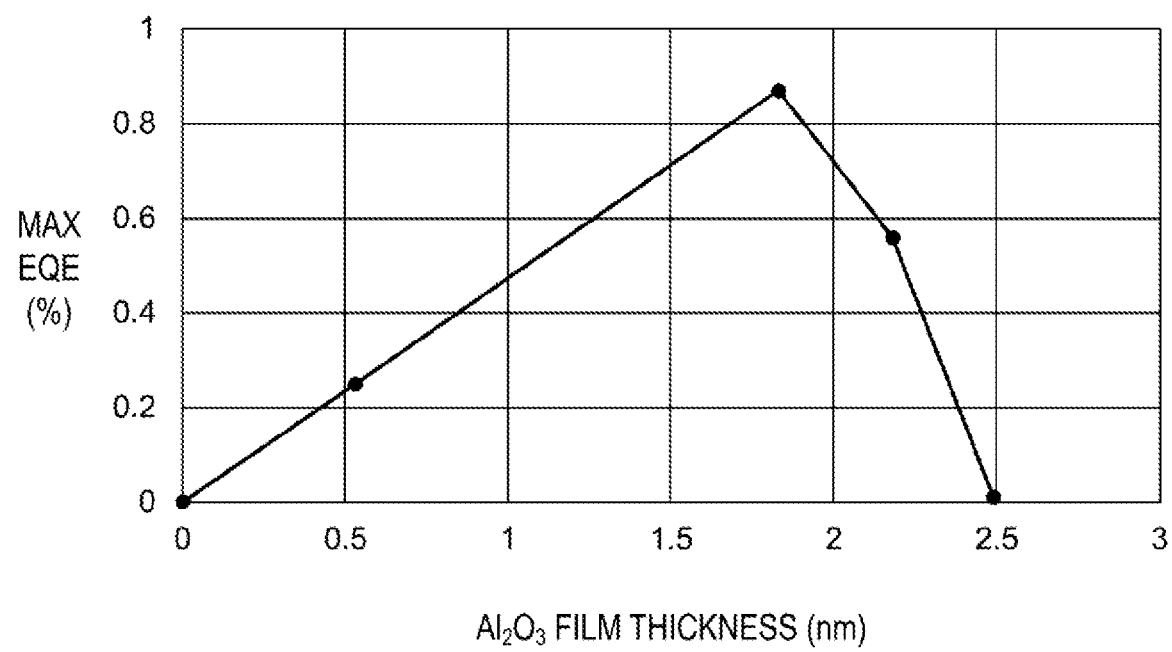
FIG. 2 is a diagram illustrating a relationship between a film thickness of a hole tunneling insulating layer (first hole tunneling insulating layer) provided in the light-emitting element according to the first embodiment and an external quantum efficiency of the light-emitting element.

FIG. 2 is a diagram illustrating a relationship between the film thickness of the hole tunneling insulating layer 2 included in the light-emitting element 10 according to the first embodiment and an external quantum efficiency (EQE) of the light-emitting element 10.

As illustrated in FIG. 2, when aluminum oxide ($Al_2O_3$) as the hole tunneling insulating layer 2 had a film thickness of 0.53 nm, 1.83 nm, 2.18 nm, and 2.49 nm, values of the maximum external quantum efficiency (maximum EQE) of the light-emitting element 10 were 0.25%, 0.87%, 0.56%, and 0.012%, respectively. It is thought that the reason why the value of the maximum external quantum efficiency (maximum EQE) of the light-emitting element 10 is 0.012%, which is low, when the film thickness of aluminum oxide ($Al_2O_3$) as the hole tunneling insulating layer 2 is 2.49 nm is that when the film thickness of the hole tunneling insulating layer 2 is greater than 2.2 nm, probability that tunneling of holes occurs is reduced. From the above, when only the value of the maximum external quantum efficiency (maximum EQE) of the light-emitting element 10 is considered, the hole tunneling insulating layer 2 only need be formed to have a film thickness of 2.2 nm or less, but as described above, when the film thickness of the hole tunneling insulating layer 2 is less than 0.1 nm, film forming is difficult, and thus the hole tunneling insulating layer 2 is preferably formed to have a film thickness of 0.1 nm or greater and 2.2 nm or less.

Figure 3:
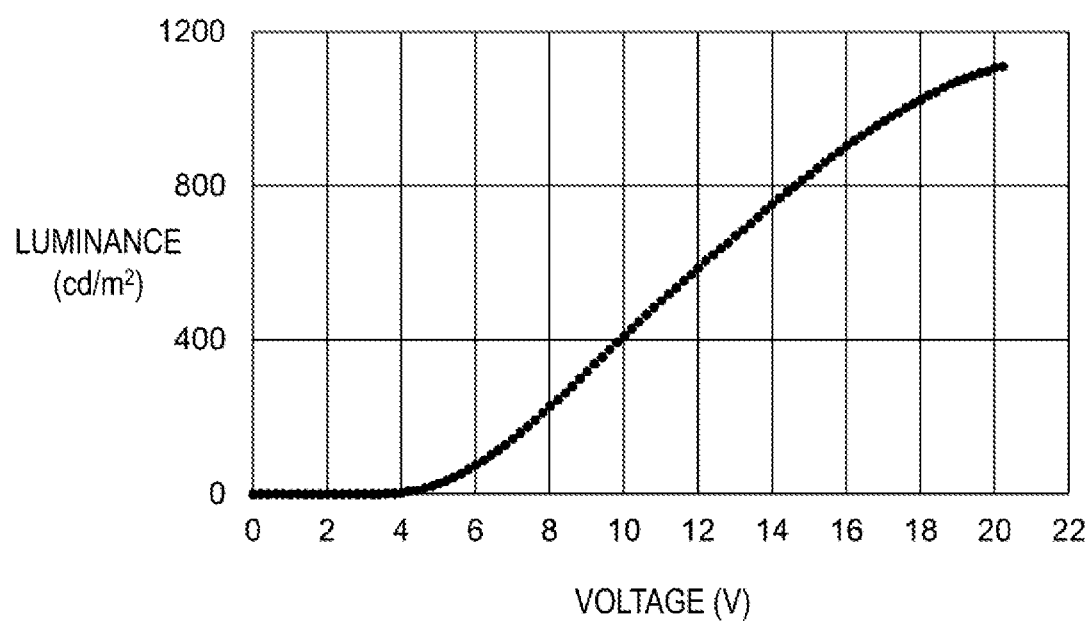
FIG. 3 is a diagram illustrating a relationship between a voltage and a luminance of the light-emitting element in a case where the hole tunneling insulating layer (first hole tunneling insulating layer) provided in the light-emitting element according to the first embodiment is formed by an atomic layer deposition process (ALD) and has a film thickness of 0.5 nm.

FIG. 3 is a diagram illustrating a relationship between a voltage and a luminance of the light-emitting element 10 in a case in which the light-emitting element 10 according to the first embodiment is formed by the atomic layer deposition process (ALD) and includes aluminum oxide ($Al_2O_3$) having a film thickness of 0.5 nm as the hole tunneling insulating layer 2.

As illustrated in FIG. 3, when the hole tunneling insulating layer 2 is formed by the atomic layer deposition process (ALD) and includes a film thickness of 0.5 nm, which is relatively small, it is possible to realize the light-emitting element 10 capable of controlling a luminance of 0 to 1100 ($cd/m^2$) with a relatively low drive voltage (applied voltage) of 20 V or less.

Figure 4:
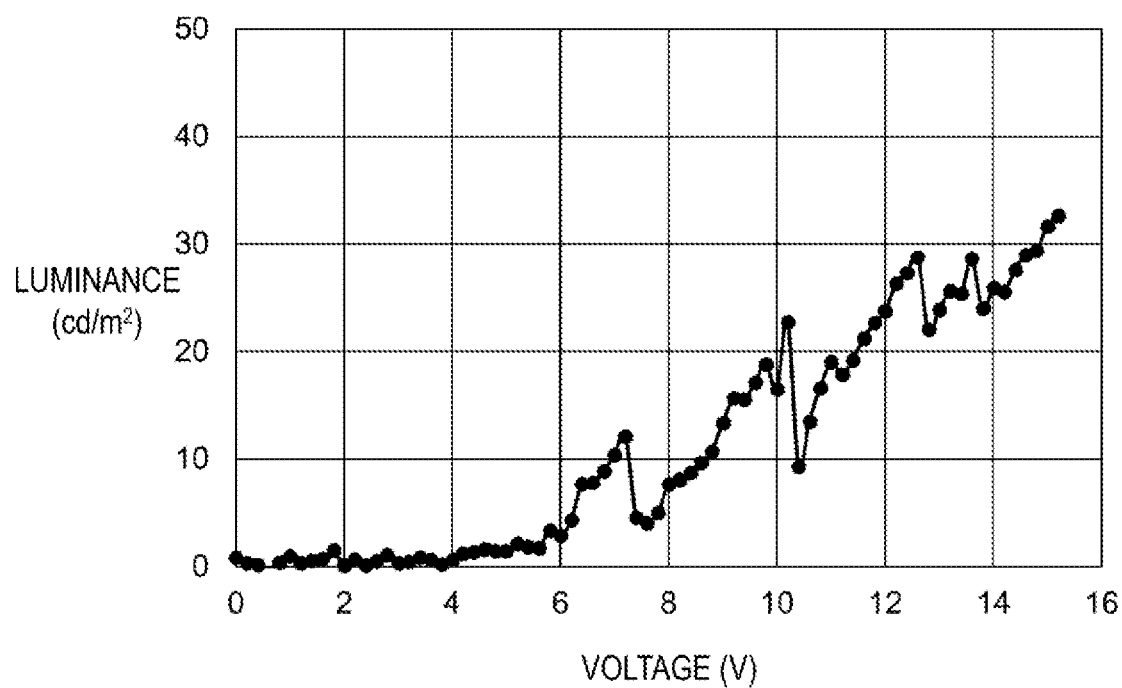
FIG. 4 is a diagram illustrating a relationship between a voltage and a luminance of a light-emitting element in a case where the light-emitting element, which is a modified example of the first embodiment, is sputtered and includes a hole tunneling insulating layer (first hole tunneling insulating layer) having a film thickness of 1.0 nm.

FIG. 4 is a diagram illustrating a relationship between a voltage and a luminance of a light-emitting element in a case in which the light-emitting element, which is a modified example of the first embodiment, is sputtered and includes aluminum oxide ($Al_2O_3$) having a film thickness of 1.0 nm as a hole tunneling insulating layer.

As illustrated in FIG. 4, when the hole tunneling insulating layer included in the light-emitting element, which is the modified example of the first embodiment, is formed by sputtering to have a film thickness of 1.0 nm, the light-emitting element capable of controlling the luminance of 0 to 32 ($cd/m^2$) at a drive voltage (applied voltage) of 15.2 V or less can be realized.

Figure 5:
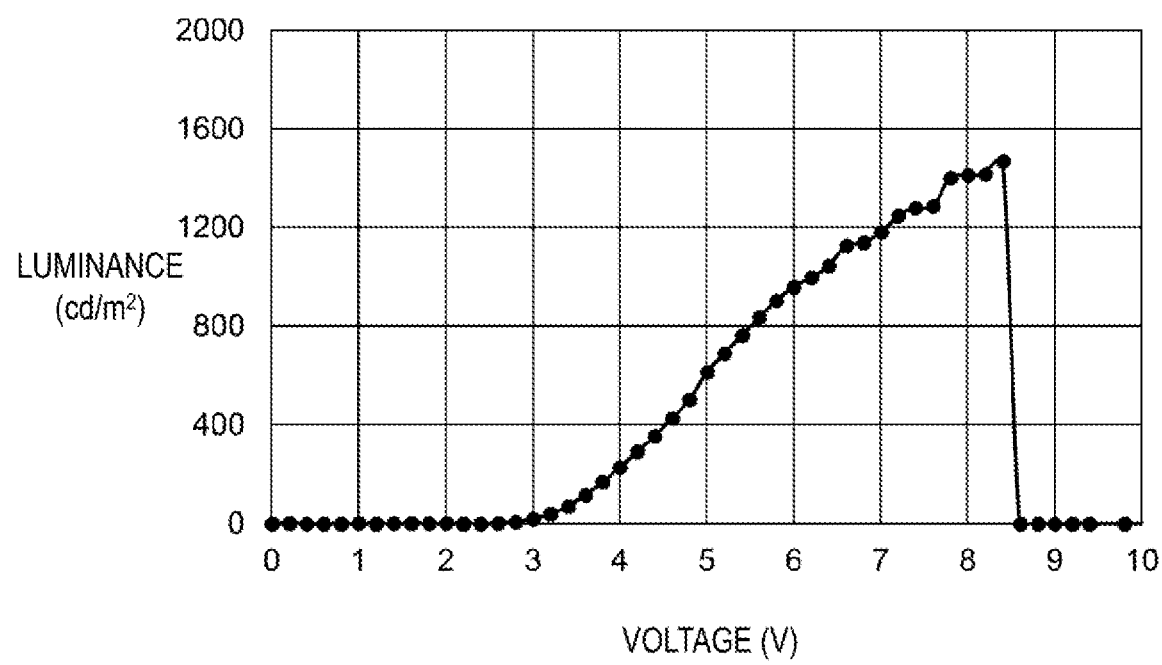
FIG. 5 is a diagram illustrating a relationship between a voltage and a luminance of a light-emitting element in a case where the light-emitting element, which is a further modified example of the first embodiment, is sputtered and includes a hole tunneling insulating layer (first hole tunneling insulating layer) having a film thickness of 0.5 nm.

FIG. 5 is a diagram illustrating a relationship between a voltage and a luminance of a light-emitting element in a case in which the light-emitting element, which is a further modified example of the first embodiment, is sputtered and includes aluminum oxide ($Al_2O_3$) having a film thickness of 0.5 nm as a hole tunneling insulating layer.

As illustrated in FIG. 5, when the hole tunneling insulating layer included in the light-emitting element, which is the further modified example of the first embodiment, is sputtered and formed to have a film thickness of 0.5 nm, which is relatively small, a light-emitting element capable of controlling the luminance of 0 to 1470 ($cd/m^2$) at a relatively low drive voltage (applied voltage) of 8.4 V or less can be realized.

Figure 6:
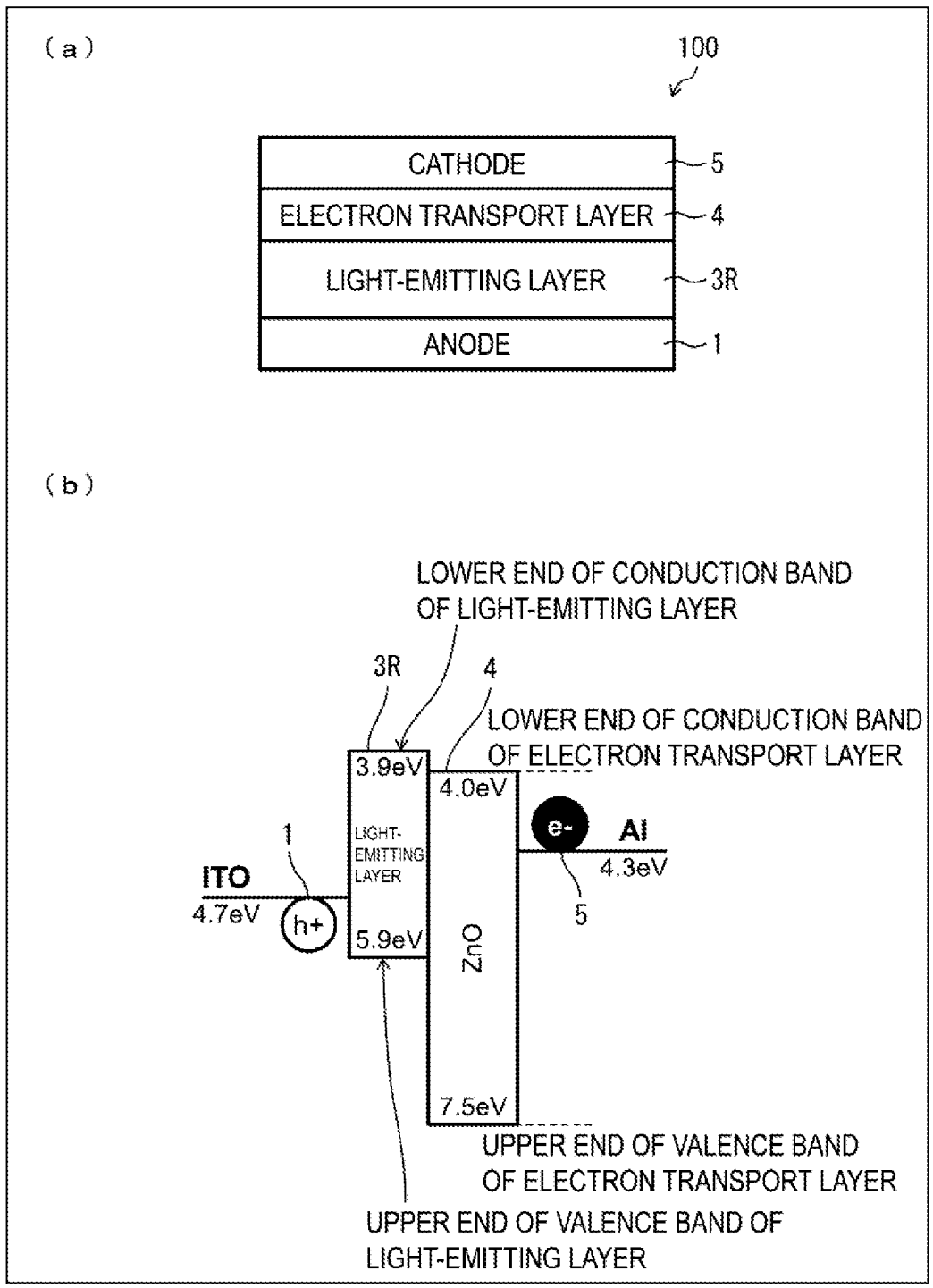
FIG. 6(a) is a diagram illustrating a schematic configuration of a light-emitting element of Comparative Example 1.
FIG. 6(b) is an energy band diagram of the light-emitting element of Comparative Example 1.

(a) of FIG. 6 is a diagram illustrating a schematic configuration of a light-emitting element 100 of Comparative Example 1, and (b) of FIG. 6 is an energy band diagram of the light-emitting element 100 of Comparative Example 1.

The light-emitting element 100 of Comparative Example 1 illustrated in (a) of FIG. 6 and (b) of FIG. 6 differs from the light-emitting element 10 of the first embodiment described above in that the hole tunneling insulating layer 2 is not provided. between the anode 1 and the light-emitting layer 3R. In such a configuration of the light-emitting element 100 of Comparative Example 1, the anode 1 and the light-emitting layer 3R are in direct contact with each other, and thus, generated excitons are heat-inactivated and do not emit light. Accordingly, it is necessary to provide the hole tunneling insulating layer 2 between the anode 1 and the light-emitting layer 3R as in the light-emitting element 10 of the first embodiment described above, or it is necessary to provide a hole transport layer between the anode 1 and the light-emitting layer 3R as in the related art.

However, in a case of the hole transport layer in the related art, it is known that a hole transport function cannot be ensured unless the film thickness thereof is 30 nm or greater. When a hole transport layer having a film thickness of 30 nm or greater is formed, light absorption by the hole transport layer is problematic. Furthermore, control of an interface between the hole transport layer and a layer adjacent thereto, and selection of a layer adjacent to the hole transport layer are required, which complicates a step of forming the hole transport layer. In addition, when a conductive hole transport layer is used, holes are trapped at an interface between the conductive hole transport layer and the anode adjacent thereto and at an interface between the conductive hole transport layer and the light-emitting layer adjacent thereto to generate a non-light-emitting center, which is problematic. In particular, in a case of a hole transport layer having a film thickness of 30 nm or greater, holes injected from the anode 1 cannot be transported to the light-emitting layer 3R by tunneling, that is, quantum tunneling effect, and thus, in order to transport holes injected from the anode 1, it is necessary to select a hole transport layer having an ionization potential value relatively close to the ionization potential value of the light-emitting layer 3R, so that there are fewer options of the material, which is problematic. For such a reason, in the present embodiment, the hole tunneling insulating layer 2 is provided between the anode 1 and the light-emitting layer 3R.

Figure 7:
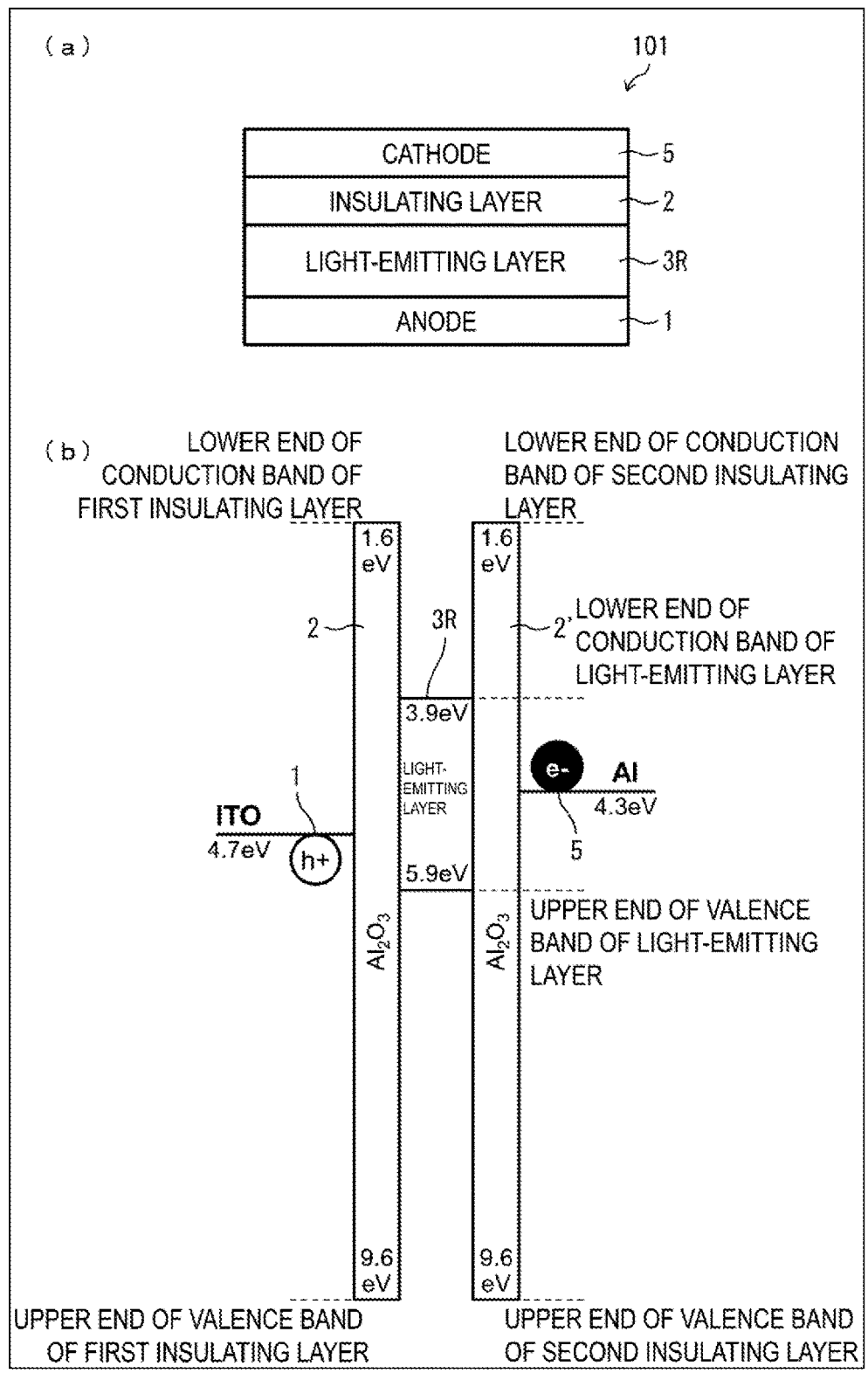
FIG. 7(a) is a diagram illustrating a schematic configuration of a light-emitting element of Comparative Example 2.
FIG. 7(b) is an energy band diagram of the light-emitting element of Comparative Example 3.

(a) of FIG. 7 is a diagram illustrating a schematic configuration of a light-emitting element 101 of Comparative Example 2, and (b) of FIG. 7 is an energy band diagram of a light-emitting element of Comparative Example 3.

Figure 8:
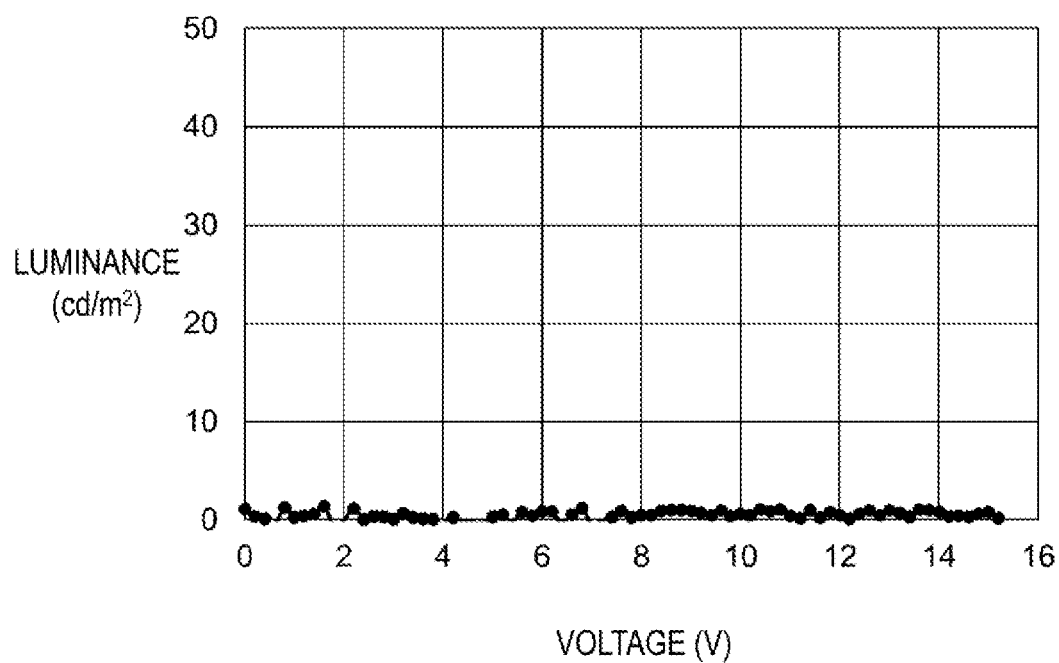
FIG. 8 is a diagram illustrating a relationship between a voltage and a luminance of a light-emitting element of Comparative Example 3.

FIG. 8 is a diagram illustrating a relationship between a voltage and a luminance of the light-emitting element of Comparative Example 3.

The light-emitting element 101 of Comparative Example 2 illustrated in (a) of FIG. 7 differs from the light-emitting element 10 of the first embodiment described above in that the hole tunneling insulating layer 2 is not provided between the anode 1 and the light-emitting layer 3R and the hole tunneling insulating layer 2 is provided as an insulating layer rather than an electron transport layer between the cathode 5 and the light-emitting layer 3R. In a case of such a configuration of the light-emitting element 101 of Comparative Example 2, the anode 1 and the light-emitting layer 3R are in direct contact with each other, and thus, generated excitons are heat-inactivated and do not emit light. Accordingly, it is necessary to provide the hole tunneling insulating layer 2 between the anode 1 and the light-emitting layer 3R as in the light-emitting element 10 of the first embodiment described above, or it is necessary to provide a hole transport layer between the anode 1 and the light-emitting layer 3R as in the related art. In addition, in the case of the configuration of the light-emitting element 101 of Comparative Example 2, the hole tunneling insulating layer 2 is provided as an insulating layer rather than an electron transport layer between the cathode 5 and the light-emitting layer 3R, and thus, holes are easily released from the light-emitting layer 3R to the cathode 5, that is, overflow of holes is large, so that a relatively high voltage is required to cause the light-emitting element 101 to emit light, which is problematic. For such a reason, in the present embodiment, the electron transport layer 4 is provided between the cathode 5 and the light-emitting layer 3R.

The light-emitting element of Comparative Example 3 illustrated in (b) of FIG. 7 differs from the light-emitting element 10 of the first embodiment described above in that a hole tunneling insulating layer 2' same as the hole tunneling insulating layer 2 which is the first insulating layer is provided as a second insulating layer rather than an electron transport layer between the cathode 5 and the light-emitting layer 3R. in a case of such a configuration of the light-emitting element of Comparative Example 3, holes are easily released from the light-emitting layer 3R to the cathode 5, that is, overflow of holes is large, and thus, as illustrated in FIG. 8, a light-emitting element capable of controlling a luminance at a low drive voltage (applied voltage) cannot be realized, so that a relatively high voltage is required to cause the light-emitting element to emit light, which is problematic. For such a reason, in the present embodiment, the electron transport layer 4 is provided between the cathode 5 and the light-emitting layer 3R.

Second Embodiment

Next, with reference to FIG. 9, a second embodiment of the disclosure will be described, A light-emitting element 20 of the present embodiment is a light-emitting element configured to emit green light, and is different from the first embodiment in that the light-emitting element 20 includes a light-emitting layer 3G having an emission peak wavelength in a wavelength region of green light, a hole tunneling insulating layer 12, and an electron transport layer 14, and the other details are as described in the first embodiment. For convenience of description, members having the same functions as those of the members illustrated in the diagrams in the first embodiment are denoted by the same reference numerals, and descriptions thereof will be omitted.

Figure 9:
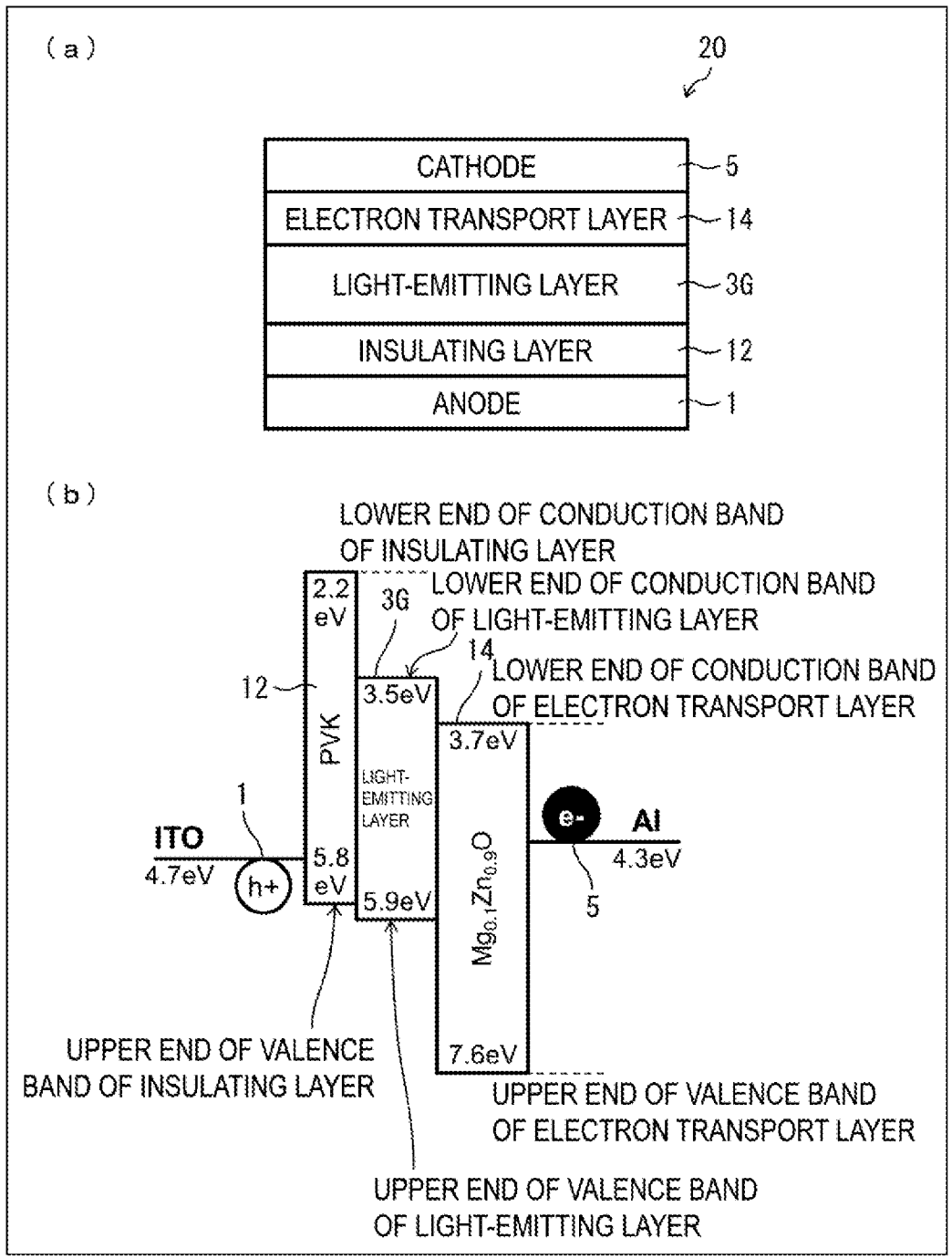
FIG. 9(a) is a diagram illustrating a schematic configuration of a light-emitting element according to a second embodiment.
FIG. 9(b) is an energy band diagram of the light-emitting element according to the second embodiment.

(a) of FIG. 9 is a diagram illustrating a schematic configuration of the light-emitting element 20 of the second embodiment, and (b) of FIG. 9 is an energy band diagram of the light-emitting element 20 of the second embodiment.

As illustrated in (a) of FIG. 9, the light-emitting element 20 (second light-emitting element) includes the anode 1, the light-emitting layer 3G including quantum dots, and the cathode 5. Furthermore, the light-emitting element 20 includes the electron transport layer 14 (second electron transport layer) between the cathode 5 and the light-emitting layer 3G (second light-emitting layer). In addition, the light-emitting element 20 includes the hole tunneling insulating layer 12 (second hole tunneling insulating layer) between the anode 1 and the light-emitting layer 3G and in contact with the anode 1 and the light-emitting layer 3G.

In (a) of FIG. 9 and (b) of FIG. 9, the hole tunneling insulating layer 12 simply illustrated as an insulating layer is provided between the anode 1 and the light-emitting layer 3G, and is in contact with both the anode 1 and the light-emitting layer 3G.

On the other hand, in the present embodiment, a. description is given taking, as an example, a case in which the electron transport layer 14 is provided between the cathode 5 and the light-emitting layer 3G and is in contact with both the cathode 5 and the light-emitting layer 3G, but the disclosure is not limited thereto, and as long as the electron transport layer 14 is provided between the cathode 5 and the light-emitting layer 3G, the electron transport layer 14 need not be in contact with both the cathode 5 and the light-emitting layer 3G, and may be in contact with only one of the cathode 5 and the light-emitting layer 3G.

The light-emitting layer 3G is a light-emitting layer including quantum dots (nanoparticles), any one of CdSe/CdS, CdSe/ZnS, InP/ZnS, ZnTe—ZnSe/ZnS, ZnTe—ZnS/ZnS, CIGS/ZnS, ZnSe, and InP may be used as the quantum dots, for example, and a particle size of each of the quantum dots is about 2 to 10 nm, for example.

The light-emitting element 20 is a light-emitting element configured to emit green light, and the light-emitting layer 3G included in the light-emitting element 20 has the emission peak wavelength in the wavelength region of green light. In the present embodiment, by selecting the quantum dots selected in the first embodiment described above such that the emission peak wavelength thereof is in the wavelength region of green light, and appropriately adjusting a magnitude of a particle size of each of the quantum dots, the light-emitting layer 3G having a lower end of a conduction band of the light-emitting layer 30, that is, an electron affinity value of 3.5 eV, and an upper end of a valence band of the light-emitting layer 3G, that is, an ionization potential value of 5.9 eV was formed, as illustrated in (b) of FIG. 9. Note that as long as a difference between the lower end of the conduction band of the light-emitting layer 3G and the upper end of the valence band of the light-emitting layer 30 (difference in the band gap), that is, the emission peak wavelength of the light-emitting layer 3G is in the wavelength region of green light, the electron affinity value and the ionization potential value are not limited to the values described above.

Note that, in the light-emitting layer 3R including quantum dots (see FIG. 1) and the light-emitting layer 3G including quantum dots, in which only the magnitudes of the particle sizes of the quantum dots differ and the emission peak wavelengths differ, there is generally no difference in the upper end of the valence band, that is, the ionization potential value, but there occurs a difference in the lower end of the conduction band, that is, the electron affinity value. This is caused by the following reason: a band shift due to a size effect of quantum dots is inversely proportional to an effective mass, and the effective mass is inversely proportional to a curvature (value obtained by differentiating the band twice). Generally, the curvature of the valence band is small, and the effective mass of a hole is large. On the other hand, the curvature of the conduction hand is small, and the effective mass of an electron is small. Thus, the band shift due to the size effect of the quantum dots appears more significantly in the conduction band than in the valence band.

The hole tunneling insulating layer 12 is an insulating layer that transports holes injected from the anode 1 to the light-emitting layer 3G by tunneling, that is, quantum tunneling effect. The hole tunneling insulating layer 12 may be composed of an inorganic material or may be composed of an organic material. Furthermore, the hole tunneling insulating layer 12 may he constituted by a plurality of layers composed of different materials, and may he constituted by two layers, for example, a layer composed of an inorganic material and a layer composed of an organic material. When the hole tunneling insulating layer 12 is composed of an inorganic material, the hole tunneling insulating layer 12 may include any one of aluminum oxide, silicon oxide, silicon oxynitride, and silicon nitride. Furthermore, when the hole tunneling insulating layer 12 is composed of an organic material, the hole tunneling insulating layer 12 may include any one of polymetllyl methacrylate (PMMA), polyvinyl carbazole (PVK), and poly[(9,9-dioctylfluorenyl-2,7-diyl)-co-(4,4'-(N-(4-sec-butylphenyl))diphenylamine)] (TFB).

Note that for the tight-emitting layer 3G, aluminum oxide ($Al_2O_3$) or polyvinyl carbazole (PVK) is preferably used as the hole tunneling insulating layer 12, and in the present embodiment, polyvinyl carbazole (PVK) was used as the hole tunneling insulating layer 12. Furthermore, in the present embodiment, polyvinyl carbazole (PVK) as the hole tunneling insulating layer 12 was dissolved in, for example, chlorobenzene, and the dissolved solution was applied and dried for formation to form the hole tunneling insulating layer 12 having the lower end of the conduction band of the hole tunneling insulating layer 12, that is, an electron affinity value of 2.2 eV and the upper end of the valence band of the hole tunneling insulating layer 12, that is, an ionization potential. value of 5.8 eV, as illustrated in (b) of FIG. 9. In the present embodiment, a description is given taking, as an example, a case in which the hole tunneling insulating layer 12 is applied and dried for formation, but the disclosure is not limited thereto, In the present embodiment, on the ground that when the film thickness of the hole tunneling insulating layer 12 is less than 0.1 nm, film formation is difficult, and when the film thickness of the hole tunneling insulating layer 12 is greater than 2.2 nm, a probability that tunneling of holes occurs is low, the hole tunneling insulating layer 12 was formed to have a film thickness of 0.5 nm, whereas the film thickness is not particularly limited as long as tunneling of holes occurs.

Furthermore, in the present embodiment, as illustrated in (b) of FIG. 9, the electron affinity value (2.2 eV) of the hole tunneling insulating layer 12 is smaller than the electron affinity value (3.5 eV) of the light-emitting layer 3G by 1.3 eV, but is not limited thereto. In addition, from the perspective of suppressing overflow of electrons from the light-emitting layer 3G to the anode 1, the electron affinity value of the hole tunneling insulating layer 12 is preferably smaller than the electron affinity value of the light-emitting layer 3G by 0.5 eV or greater.

In addition, in the present embodiment, the ionization potential value (5.8 eV) of the hole tunneling insulating layer 12 is greater than a value (5.4 eV) obtained by subtracting 0.5 eV from the ionization potential value (5.9 eV) of the light-emitting layer 3G, but the disclosure is not limited thereto.

As described above, as long as tunneling of holes occurs, the film thickness, the electron affinity value, and the ionization potential value of the hole tunneling insulating layer 12 are not particularly limited.

Note that from the perspective of ensuring insulation, the hole tunneling insulating layer 12 preferably has a band gap of 3 eV or greater, and in the present embodiment, polyvinyl carbazole (PVK) formed by application and drying having a band gap of 3.6 eV was used as the hole tunneling insulating layer 12.

Note that the film thickness of the electron transport layer 14 is preferably 20 to 150 nm, and in the present embodiment, the electron transport layer 14 was formed to have a film thickness of 50 nm.

In the present embodiment, a layer containing any one of zinc oxide, titanium oxide, and magnesium zinc oxide is preferably used as the electron transport layer 14, and magnesium zinc oxide ($Mg_{0.1}Zn_{0.90}$) was used as the electron transport layer 14. As illustrated in (b) of FIG. 9, magnesium zinc oxide ($Mg_{0.1}Zn_{0.9}O$) as the electron transport layer 14 has a lower end of the conduction band, that is, an electron affinity value of 3.7 eV, and an upper end of the valence band, that is, an ionization potential value of 7.6 eV. Accordingly, the difference between the electron affinity value (3.7 eV) of the electron transport layer 14 and the electron affinity value (3.5 eV) of the light-emitting layer 3G is less than 0.5 eV, which is small, so that electrons injected to the electron transport layer 14 from the cathode 5 are transported to the light-emitting layer 3(1 without energy barrier. Furthermore, the difference between the ionization potential value (7.6 eV) of the electron transport layer 14 and the ionization potential value (5.9 eV) of the light-emitting layer 3G is 0.5 eV or greater, which is large, so that overflow of holes from the light-emitting layer 3G to the cathode 5 can be suppressed.

In the present embodiment, a description has been given taking, as an example, the case in which $Mg_{0.1}Zn_{0.90}$ is used as magnesium zinc oxide that constitutes the electron transport layer 14, but the disclosure is not limited thereto, and $Mg_xZn_{1-x}O$ (0<x<0.5) obtained by adding Mg to ZnO can be used.

Note that the electron transport layer 14 may be formed of nanoparticles, and in the present embodiment, the electron transport layer 14 was formed of magnesium zinc oxide ($Mg_{0.1}Zn_{0.90}$) nanoparticles.

Third Embodiment

Next, a third embodiment according to the disclosure will be described with reference to FIG. 10, A light-emitting element 30 of the present embodiment is a light-emitting element configured to emit blue light, and is different from the first and second embodiments in that the light-emitting element 30 includes a light-emitting layer 3B having an emission peak wavelength in a wavelength region of blue light, a hole tunneling insulating layer 22, and an electron transport layer 24, and the other details are as described in the first and second embodiments. For the sake of the description, members having the same functions as the members illustrated in the diagrams in the first and second embodiments are denoted by the same reference numerals, and descriptions thereof will be omitted.

Figure 10:
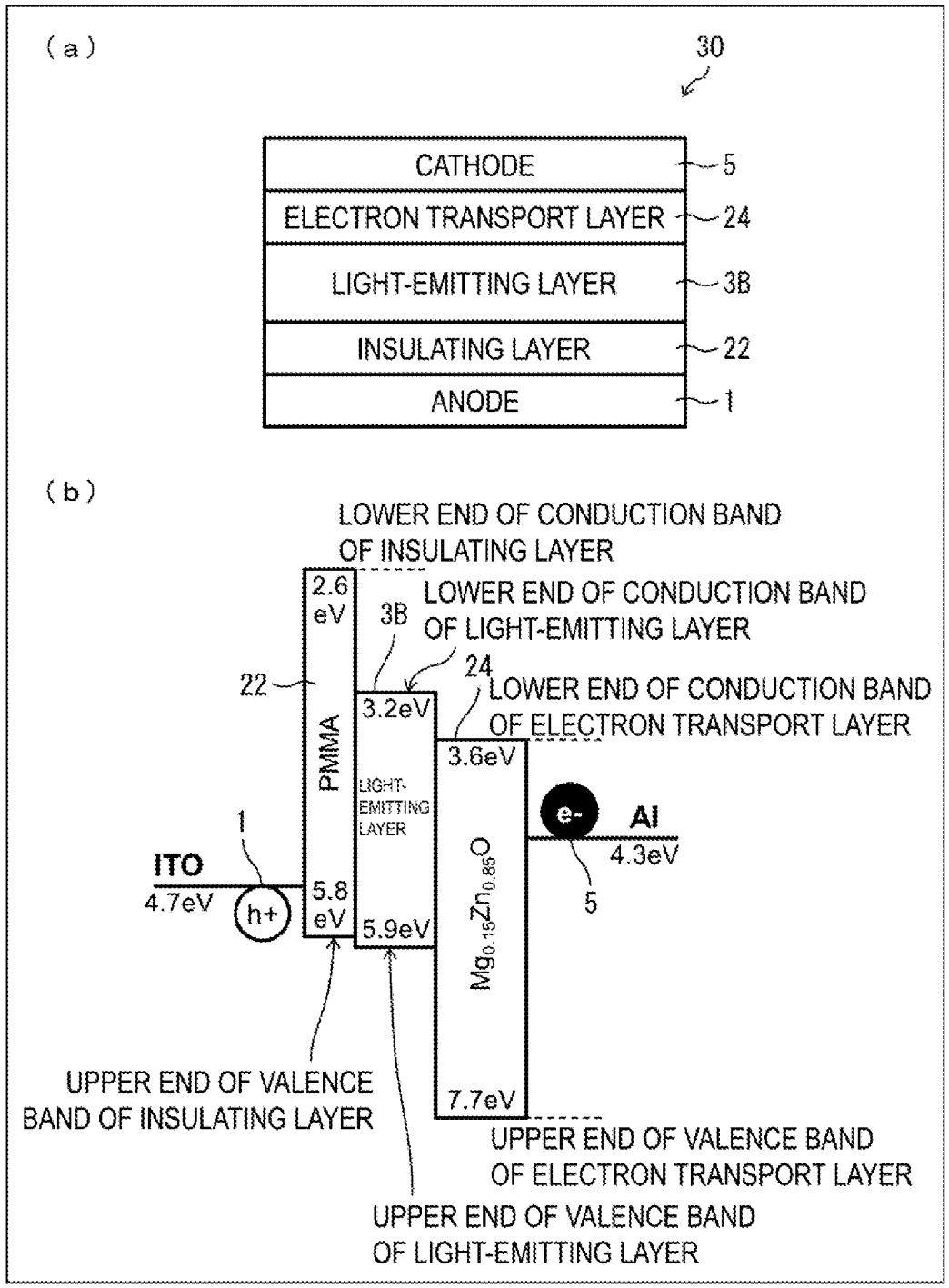
FIG. 10(a) is a diagram illustrating a schematic configuration of a light-emitting element according to a third embodiment.
FIG. 10(b) is an energy band diagram of the light-emitting element according to the third embodiment.

(a) of FIG. 10 is a diagram illustrating a schematic configuration of the light-emitting element 30 of the third embodiment, and (b) of FIG. 10 is an energy band diagram of the light-emitting element 30 of the third embodiment.

As illustrated in (a) of FIG. 10, the light-emitting element 30 (third light-emitting element) includes an anode 1, a light-emitting layer 3B including quantum dots, and a cathode 5. Furthermore, the light-emitting element 30 includes an electron transport layer 24 (third electron transport layer) between the cathode 5 and the light-emitting layer 3B (third light-emitting layer). The light-emitting element 30 includes a hole tunneling insulating layer 22 (third hole tunneling insulating layer) between the anode 1 and the light-emitting layer 3B and in contact with the anode 1 and the light-emitting layer 3B.

In (a) of FIG. 10 and (b) of FIG. 10, the hole tunneling insulating layer 22, which is illustrated simply as an insulating layer, is provided between the anode 1 and the light-emitting layer 3B, and is in contact with both the anode 1 and the light-emitting layer 3B.

On the other hand, in the present embodiment, a description is given taking, as an example, a case in which the electron transport layer 24 is provided between the cathode 5 and the light-emitting layer 3B and is in contact with both the cathode 5 and the light-emitting layer 3B, but the disclosure is not limited thereto, and as long as the electron transport layer 24 is provided between the cathode 5 and the tight-emitting layer 3B, the electron transport layer 14 need not be in contact with both the cathode 5 and the light-emitting layer 3B, and may be in contact with only one of the cathode 5 and the light-emitting layer 313.

The light-emitting layer 3B is a light-emitting layer including quantum dots (nanoparticles), any one of CdSe/CdS, CdSe/ZnS, InP/ZnS, ZnTe—ZnSe/ZnS, ZnTe—ZnS/ZnS, CIGS/ZnS, ZnSe, and InP may be used as the quantum dots, for example, and a particle size of each of the quantum dots is about 2 to 10 nm, for example.

The light-emitting element 30 is a light-emitting element configured to emit blue light, and the light-emitting layer 3B included in the light-emitting element 30 has the emission peak wavelength in the wavelength region of blue light. In the present embodiment, by selecting the quantum dots selected in the first and second embodiments described above such that the emission peak wavelength thereof is in the wavelength region of blue light, and appropriately adjusting a magnitude of a particle size of each of the quantum dots, the light-emitting layer 3B having a lower end of a conduction band of the light-emitting layer 3B, that is, an electron affinity value of 3.2 eV, and an upper end of a valence band of the light-emitting layer 3B, that is, an ionization potential value of 5.9 eV was formed, as illustrated in (b) of FIG. 10. Note that as long as a difference between the lower end of the conduction band of the light-emitting layer 3B and the upper end of the valence band of the light-emitting layer 3B (difference in the band gap), that is, the emission peak wavelength of the light-emitting layer 3B is in the wavelength region of blue light, the electron affinity value and the ionization potential value are not limited to the values described above.

The hole tunneling insulating layer 22 is an insulating layer that transports holes injected from the anode 1 to the light-emitting layer 3B by tunneling, that is, quantum tunneling effect. The hole tunneling insulating layer 22 may be composed of an inorganic material or may be composed of an organic material. Furthermore, the hole tunneling insulating layer 22 may be constituted by a plurality of layers composed of different materials, and may be constituted by two layers, for example, a layer composed of an inorganic material and a layer composed of an organic material. When the hole tunneling insulating layer 22 is composed of an inorganic material, the hole tunneling insulating layer 22 may include any one of aluminum oxide, silicon oxide, silicon oxynitride, and silicon nitride. Furthermore, when the hole tunneling insulating layer 22 is composed of an organic material, the hole tunneling insulating layer 22 may include any one of polymethyl methacrylate (PMMA), polyvinyl carbazole (PVK), and poly[(9,9-dioctylfluorenyl-2,7-diyl)-co-(4,4'-(N-(4-sec-butylphenyl))diphenylamine)] (TFB).

Note that for the light-emitting layer 3B, silicon nitride, polyvinyl carbazole (PVK), or polymethyl methacrylate (PMMA) is preferably used as the hole tunneling insulating layer 22, and polymethyl methacrylate (PMMA) was used as the hole tunneling insulating layer 22 in the present embodiment. Furthermore, in the present embodiment, polymethyl methacrylate (PMMA) as the hole tunneling insulating layer 22 was dissolved in, for example, acetone, and the dissolved solution was applied and dried for formation to form the hole tunneling insulating layer 22 having the lower end of the conduction band of the hole tunneling insulating layer 22, that is, an electron affinity value of 2.6 eV and the upper end of the valence band of the hole tunneling insulating layer 22, that is, an ionization potential value of 5.8 eV, as illustrated in (b) of FIG. 10. In the present embodiment, a description is given taking, as an example, a case in which the hole tunneling insulating layer 22 was applied and dried for formation, but the disclosure is not limited thereto.

In the present. embodiment, on the ground that when the film thickness of the hole tunneling insulating layer 22 is less than 0.1 nm, film formation is difficult, and when the film thickness of the hole tunneling insulating layer 22 is greater than 2.2 nm, a probability that tunneling of holes occurs is low, the hole tunneling insulating layer 22 was formed to have a film thickness of 0.5 nm, whereas the film thickness is not particularly limited as long as tunneling of holes occurs.

Furthermore, in the present embodiment, as illustrated in (b) of HG. 10, the electron affinity value (2.6 eV) of the hole tunneling insulating layer 22 is smaller than the electron affinity value (3.2 eV) of the light-emitting layer 3B by 0.6 eV, but is not limited thereto. Furthermore, from the perspective of suppressing overflow of electrons from the light-emitting layer 3B to the anode 1, the electron affinity value of the hole tunneling insulating layer 22 is preferably smaller than the electron affinity value of the light-emitting layer 3B by 0.5 eV or greater.

In addition, in the present embodiment, the ionization potential value (5.8 eV) of the hole tunneling insulating layer 22 is greater than a value (5.4 eV) obtained by subtracting 0.5 eV from the ionization potential value (5.9 eV) of the light-emitting layer 3B, but the disclosure is not limited thereto.

As described above, as long as tunneling of holes occurs, the film thickness, the electron affinity value, and the ionization potential value of the hole tunneling insulating layer 22 are not particularly limited.

Note that, from the perspective of ensuring insulation, the hole tunneling insulating layer 22 preferably has a band gap of 3 eV or greater, and in the present embodiment, polymethyl methacrylate (PMMA) formed by application and drying having a band gap of 3.2 eV was used as the hole tunneling insulating layer 22.

Note that the film thickness of the electron transport layer 24 is preferably 20 to 150 nm, and in the present embodiment, the electron transport layer 24 was formed to have a film thickness of 50 nm.

In the present embodiment, a layer containing any one of zinc oxide, titanium oxide, or magnesium zinc oxide is preferably used as the electron transport layer 24, and magnesium zinc oxide ($Mg_{0.15}Zn_{0.85}O$) was used as the electron transport layer 24. As illustrated in (b) of FIG. 10, magnesium zinc oxide ($Mg_{0.15}Zn_{0.85}O$) as the electron transport layer 24 has a lower end of the conduction band, that is, an electron affinity value of 3.6 eV, and an upper end of the valence band, that is, an ionization potential value of 7.7 eV. Accordingly, the difference between the electron affinity value (3.6 eV) of the electron transport layer 24 and the electron affinity value (3.2 eV) of the light-emitting layer 3B is less than 0.5 eV, which is small, so that electrons injected to the electron transport layer 24 from the cathode 5 are transported to the light-emitting layer 3B without energy barrier. Furthermore, the difference between the ionization potential value (7.7 eV) of the electron transport layer 24 and the ionization potential value (5.9 eV) of the light-emitting layer 313 is 0.5 eV or greater, which is large, so that overflow of holes from the light-emitting layer 3B to the cathode 5 can be suppressed.

In the present embodiment, a description has been given taking, as an example, the case in which $Mg_{0.15}Zn_{0.85}O$ is used as magnesium zinc oxide that constitutes the electron transport layer 24, but the disclosure is not limited thereto, and $Mg_yZn_{1-y}O$ (0.12<y<0.5) obtained by adding Mg to ZnO can be used.

Note that the electron transport layer 24 may be formed of nanoparticles, and in the present embodiment, the electron transport layer 24 was formed of magnesium zinc oxide ($Mg_{0.15}Zn_{0.85}O$) nanoparticles.

Fourth Embodiment

Next, a fourth embodiment of the disclosure will be described with reference to FIGS. 11 and 12. A display device 50 according to the present embodiment is different from the first to third embodiments in that the display device 50 includes the light-emitting element 10, the light-emitting element 20, and the light-emitting element 30, and the other details are as described in the first to third embodiments. For convenience of description, members having the same functions as those of the members illustrated in the drawings in the first to third embodiments are denoted by the same reference numerals, and descriptions thereof will be omitted.

FIG. 11 is a diagram showing an example of a material that can be used as a hole tunneling insulating layer, and shows electron affinity values, ionization potential values, and band gap values of materials.

Figure 12:
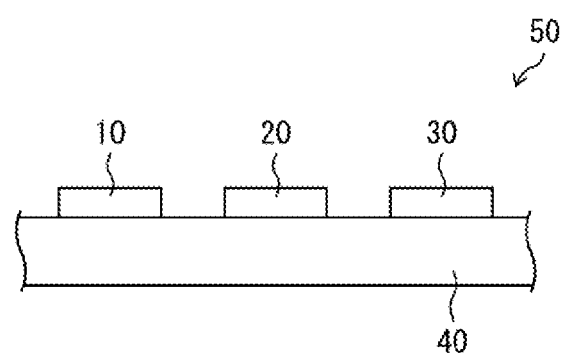
FIG. 12 is a diagram illustrating a schematic configuration of a display device including a light-emitting element according to a fourth embodiment.

FIG. 12 is a diagram illustrating a schematic configuration of the display device 50 including the light-emitting elements 10, 20, 30 according to the fourth embodiment.

As illustrated in FIG. 11, as the hole tunneling insulating layers 2, 12, 22, silicon oxynitride (SiON), silicon oxide ($SiO_2$), aluminum oxide ($Al_2O_3$), silicon nitride (SiN), polyvinyl carbazole (PVK), poly[(9,9-dioctylfluorenyl-2,7-diyl)-co-(4,4'-(N-(4-sec-butylphenyl))diphenylamine)] (TFB), polymethyl methacrylate (PMMA), or the like can be used.

As illustrated in FIG. 12, the display device 50 includes one or more light-emitting elements 10 (first light-emitting elements), one or more light-emitting elements 20 (second light-emitting elements), and one or more light-emitting elements 30 (third light-emitting elements). The light-emitting element 10, the light-emitting element 20, and the light-emitting element 30 are provided on an active matrix substrate 40 including a thin film transistor element (TFT element) as an active element for driving the light-emitting elements.

In the display device 50, each of the light-emitting element 10, the light-emitting element 20, and the light-emitting element 30 is provided on the active matrix substrate 40 such that the anode 1 is disposed on the active matrix substrate 40 side, but the configuration is not limited thereto, and the cathode 5 may be disposed on the active matrix substrate 40 side.

In the light-emitting element 10, the light-emitting element 20, and the light-emitting element 30 in the display device 50, different light-emitting layers 3R, 3G, and 3B, different hole tunneling insulating layers 2, 12, and 22, and different electron transport layers 4, 14, and 24 are used, respectively.

In the display device 50, overflow of electrons toward the anode 1 increases in order of the light-emitting element 30, the light-emitting element 20, and the light-emitting element 10, and thus, in the light-emitting element 30, polymethyl methacrylate (PMMA) having an electron affinity value of 2.6 eV was used as the hole tunneling insulating layer 22 to make an energy barrier of electrons 0.6 eV, the energy barrier being a difference from an electron affinity value (3.2 eV) of the light-emitting layer 3B, in the light-emitting element 20, polyvinyl carbazole (PVK) having an electron affinity value of 2.2 eV was used as the hole tunneling insulating layer 12 to make an energy barrier of electrons 1.3 eV, the energy barrier being a difference from an electron affinity value (3.5 eV) of the light-emitting layer 3G, and in the light-emitting element 10, aluminum oxide ($Al_2O_3$) having an electron affinity value of 1.6 eV was used as the hole tunneling insulating layer 2 to make an energy barrier of electrons 2.3 eV, the energy barrier being a difference from an electron affinity value (3.9 eV) of the light-emitting layer 3R. In other words, the energy barrier of electrons was made to be increased in order of the light-emitting element 30, the light-emitting element 20, and the light-emitting element Furthermore, in the display device 50, overflow of electrons toward the anode 1 increases in order of the light-emitting element 30, the light-emitting element 20, and the light-emitting element 10, and thus, in the light-emitting element 10, the light-emitting element 20, and the light-emitting element 30, the hole tunneling insulating layers 2, 12, 22 different from each other are preferably formed such that the film thickness in the light-emitting element 10 is greater than the film thickness in the light-emitting element 20 and the film thickness in the light-emitting element 20 is greater than the film thickness of the light-emitting element 30 within a range of film thicknesses of 0.1 nm or greater and 2.2 nm or less.

In the present embodiment, a description has been given taking, as an example, the case in which the hole tunneling insulating layers 2, 12, 22 different from each other are used in the light-emitting element 10, the light-emitting element 20, and the light-emitting element 30, but the disclosure is not limited thereto, and one hole tunneling insulating layer may be provided as a common layer in each of the light-emitting element 10, the light-emitting element 20, and the light-emitting element 30.

Preferably, an electron affinity value of the one hole tunneling insulating layer as the common layer is smaller than the smallest value (3.2 eV) of the electron affinity value (3.2 eV) of the light-emitting layer 3B, the electron affinity value (3.5 eV) of the light-emitting layer 3G, and the electron affinity value (3.9 eV) of the light-emitting layer 3R by 0.5 eV or greater, and an ionization potential value of the one hole tunneling insulating layer as the common layer is greater than a value (5.4 eV) obtained by subtracting 0.5 eV from the greatest value of the ionization potential value (5.9 eV) of the light-emitting layer 3B, the ionization potential value (5.9 eV) of the light-emitting layer 3G, and the ionization potential value (5.9 eV) of the light-emitting layer 3R. Accordingly, the one hole tunneling insulating layer as the common layer preferably includes any one of silicon oxide, aluminum oxide, silicon nitride, polyvinyl carbazole (PVK), and polymethyl methacrylate (PMMA) which are materials each having an electron affinity value of less than 2.7 eV and an ionization potential value of greater than 5.4 eV among the materials of the hole tunneling insulating layer shown in FIG. 11.

In addition, in the display device 50, overflow of electrons toward the anode 1 increases in order of the light-emitting element 30, the light-emitting element 20, and the light-emitting element 10, and thus, in the light-emitting element 10, the light-emitting element 20, and the light-emitting element 30, the hole tunneling insulating layers formed of an identical material are preferably formed such that the film thickness in the light-emitting element 10 is greater than the film thickness in the light-emitting element 20 and the film thickness in the light-emitting element 20 is greater than the film thickness of the light-emitting element 30 within a range of film thicknesses of 0.1 nm or greater and 2.2 nm or less.

From the perspective of transporting electrons without an energy barrier, preferably, in the light-emitting element 10, the light-emitting element 20, and the light-emitting element 30 in the display device 50, the electron affinity value (4.0 eV) of the electron transport layer 4 is greater than the electron affinity value (3.9 eV) of the light-emitting layer 3R by a difference of 0.5 eV or less, the electron affinity value (3.7 eV) of the electron transport layer 14 is greater than the electron affinity value (3.5 eV) of the light-emitting layer 3G by a difference of 0.5 eV or less, and the electron affinity value (3.6 eV) of the electron transport layer 24 is greater than the electron affinity value (3.2 eV) of the light-emitting layer 3B by a difference of 0.5 eV or less.

When the electron affinity value (3.2 eV) of the light-emitting layer 3B, the electron affinity value (3.5 eV) of the light-emitting layer 3G, and the electron affinity value (3.9 eV) of the light-emitting layer 3R are considered, preferably, in the light-emitting element 10, the light-emitting element 20, and the light-emitting element 30 in the display device 50, the electron affinity value (4.0 eV) of the electron transport layer 4 is greater than the electron affinity value (3.7 eV) of the electron transport layer 14, and the electron affinity value (3.7 eV) of the electron transport layer 14 is greater than the electron affinity value (3.6 eV) of the electron transport layer 24.

Supplement

First Aspect

A light-emitting element provided with an anode, a light-emitting layer including quantum dots, and a cathode, the light-emitting element including:
an electron transport layer provided between the cathode and the light-emitting layer; and
a hole tunneling insulating layer provided between the anode and the light-emitting layer and in contact with the anode and the light-emitting layer, Second Aspect The light-emitting element according to aspect 1, wherein a thickness of the hole tunneling insulating layer is 0.1 nm or greater and 2.2 nm or less.

Third Aspect

The light-emitting element according to aspect 1 or 2, wherein
an electron affinity value of the hole tunneling insulating layer is smaller than an electron affinity value of the light-emitting layer by 0.5 eV or greater, and
an ionization potential value of the hole tunneling insulating layer is greater than a value obtained by subtracting 0.5 eV from an ionization potential value of the light-emitting layer.

Fourth Aspect

The light-emitting element according to any one of aspects 1 to 3, wherein the hole tunneling insulating layer is composed of an inorganic material.

Fifth Aspect

The light-emitting element according to aspect 4, wherein the inorganic material includes any one of aluminum oxide, silicon oxide, silicon oxynitride, and silicon nitride.

Sixth Aspect

The light-emitting element according to any one of aspects 1 to 3, wherein the hole tunneling insulating layer is composed of an organic material.

Seventh Aspect

The light-emitting element according to aspect 6, wherein the organic material includes any one of polymethyl methacrylate (PMMA), polyvinyl carbazole (PVK), and poly[(9,9-dioctylfluorenyl-2,7-diyl)-co-(4,4'-(N-(4-sec-butylphenyl))diphenylamine)] (TFB).

Eighth Aspect

The light-emitting element according to any one of aspects 1 to 3, wherein the hole tunneling insulating layer includes a plurality of layers composed of different materials.

Ninth Aspect

The light-emitting element according to any one of aspects 1 to 8, wherein a band gap of the hole tunneling insulating layer is 3 eV or greater.

Tenth Aspect

The light-emitting element according to any one of aspects 1 to 9, wherein the electron transport layer includes zinc oxide or titanium oxide.

Eleventh Aspect

The light-emitting element according to any one of aspects 1 to 9, wherein the electron transport layer includes magnesium zinc oxide.

Twelfth Aspect

The light-emitting element according to aspect 10 or 11, wherein the electron transport layer is formed of nanoparticles.

Thirteenth Aspect

A display device including the light-emitting element described in aspect 1 or 2.

Fourteenth Aspect

The display device according to aspect 13, wherein
a plurality of the light-emitting elements are provided,
the plurality of the light-emitting elements include a first light-emitting element, a second light-emitting element, and a third light-emitting element,
an emission peak wavelength of the first light-emitting element is longer than an emission peak wavelength of the second light-emitting element; and the emission peak wavelength of the second light-emitting element is longer than an emission peak wavelength of the third light-emitting element.

Fifteenth Aspect

The display device according to aspect 14, wherein the first light-emitting element includes a first light-emitting layer as the light-emitting layer and a first hole tunneling insulating layer as the hole tunneling insulating layer, the second light-emitting element includes a second light-emitting layer as the light-emitting layer and a second hole tunneling insulating layer as the hole tunneling insulating layer, the third light-emitting element includes a third light-emitting layer as the light-emitting layer and a third hole tunneling insulating layer as the hole tunneling insulating layer, the first hole tunneling insulating layer, the second hole tunneling insulating layer, and the third hole tunneling insulating layer are formed of an identical material, electron affinity values of the first hole tunneling insulating layer, the second hole tunneling insulating layer, and the third hole tunneling insulating layer are smaller than the smallest value of an electron affinity value of the first light-emitting layer, an electron affinity value of the second light-emitting layer, and an electron affinity value of the third light-emitting layer by 0.5 eV or greater, and ionization potential values of the first hole tunneling insulating layer, the second hole tunneling insulating layer, and the third hole tunneling insulating layer are larger than a value obtained by subtracting 0.5 eV from the greatest value of an ionization potential value of the first light-emitting layer, an ionization potential value of the second light-emitting layer, and an ionization potential value of the third light-emitting layer.

Sixteenth Aspect

The display device according to aspect 14, wherein the first light-emitting element includes a first light-emitting layer as the light-emitting layer and a first hole tunneling insulating layer as the hole tunneling insulating the second light-emitting element includes a second light-emitting layer as the light-emitting layer and a second hole tunneling insulating layer as the hole tunneling insulating layer, the third light-emitting element includes a third light-emitting layer as the light-emitting layer and a third hole tunneling insulating layer as the hole tunneling insulating layer, the first hole tunneling insulating layer, the second hole tunneling insulating layer, and the third hole tunneling insulating layer are formed of different materials, an electron affinity value of the first hole tunneling insulating layer is smaller than an electron affinity value of the first light-emitting layer by 0.5 eV or greater, an electron affinity value of the second hole tunneling insulating layer is smaller than an electron affinity value of the second light-emitting layer by 0.5 eV or greater, an electron affinity value of the third hole tunneling insulating layer is smaller than an electron affinity value of the third light-emitting layer by 0.5 eV or greater, an ionization potential value of the first hole tunneling insulating layer is greater than a value obtained by subtracting 0.5 eV from an ionization potential value of the first light-emitting layer, an ionization potential value of the second hole tunneling insulating layer is greater than a value obtained by subtracting 0.5 eV from an ionization potential value of the second light-emitting layer, and an ionization potential value of the third hole tunneling insulating layer is greater than a value obtained by subtracting 0.5 eV from an ionization potential value of the third light-emitting layer.

Seventeenth Aspect

The display device according to aspect 16, wherein the electron affinity value of the third hole tunneling insulating layer is greater than the electron affinity value of the second hole tunneling insulating layer; and the electron affinity value of the second hole tunneling insulating layer is greater than the electron affinity value of the first hole tunneling insulating layer, Eighteenth Aspect The display device according to aspect 16 or 17, wherein the first hole tunneling insulating layer includes any one of silicon oxynitride, silicon oxide and aluminum oxide.

Nineteenth Aspect

The display device according to aspect 16 or 17, wherein the second hole tunneling insulating layer includes any one of aluminum oxide and polyvinyl carbazole (PVK).

Twentieth Aspect

The display device according to aspect 16 or 17, wherein the third hole tunneling insulating layer includes any one of silicon nitride, polyvinyl carbazole (PVK), and methacrylate (PMMA).

Twenty-First Aspect

The display device according to aspect 15, wherein the first hole tunneling insulating layer, the second hole tunneling insulating layer, and the third hole tunneling insulating layer formed of an identical material include any one of silicon oxide, aluminum oxide, silicon nitride, polyvinyl carbazole (PVK), and polymethyl methacrylate (PMMA).

Twenty-Second Aspect

The display device according to any one of aspects 15 to 21, wherein a film thickness of the first hole tunneling insulating layer is greater than a film thickness of the second hole tunneling insulating layer, and the film thickness of the second hole tunneling insulating layer is greater than a film thickness of the third hole tunneling insulating layer.

Twenty-Third Aspect

The display device according to any one of aspects 15 to 22, wherein the first light-emitting element includes a first electron transport layer as the electron transport layer, the second light-emitting element includes a second electron transport layer as the electron transport layer, the third light-emitting element includes a third electron transport layer as the electron transport layer, an electron affinity value of the first electron transport layer is greater than an electron affinity value of the first light-emitting layer by a difference of 0.5 eV or less, an electron affinity value of the second electron transport layer is greater than an electron affinity value of the second light-emitting layer by a difference of 0.5 eV or less, and an electron affinity value of the third electron transport layer is greater than an electron affinity value of the third light-emitting layer by a difference of 0.5 eV or less.

Twenty-Four Aspect

The display device according to aspect 23, wherein the electron affinity value of the first electron transport layer is greater than the electron affinity value of the second electron transport layer, and the electron affinity value of the second electron transport layer is greater than the electron affinity value of the third electron transport layer, Twenty-Fifth Aspect The display device according to any one of aspects 14 to 24, wherein the first light-emitting element is a light-emitting element configured to emit red light, the second light-emitting element is a light-emitting element configured to emit green light, and the third light-emitting element is a light-emitting element configured to emit blue light.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a light-emitting element and a display device.

The invention claimed is:
1. A light-emitting element provided with
an anode,
a light-emitting layer including quantum dots, and
a cathode,
the light-emitting element comprising:
an electron transport layer provided between the cathode and the light-emitting layer; and
a hole tunneling insulating layer provided between the anode and the light-emitting layer and in contact with the anode and the light-emitting layer, wherein
the hole tunneling insulating layer includes a plurality of layers composed of different materials.
2. The light-emitting element according to claim 1, wherein a thickness of the hole tunneling insulating layer is 0.1 nm or greater and 2.2 nm or less.
3. The light-emitting element according to claim 1, wherein an electron affinity value of the hole tunneling insulating layer is smaller than an electron affinity value of the light-emitting layer by 0.5 eV or greater, and an ionization potential value of the hole tunneling insulating layer is greater than a value obtained by subtracting 0.5 eV from an ionization potential value of the light-emitting layer.
4. The light-emitting element according to claim 1, wherein the hole tunneling insulating layer is composed of an inorganic material.
5. The light-emitting element according to claim 4, wherein the inorganic material includes any one of aluminum oxide, silicon oxide, silicon oxynitride, and silicon nitride.
6. The light-emitting element according to claim 1, wherein the hole tunneling insulating layer is composed of an organic material.
7. The light-emitting element according to claim 6, wherein the organic material includes any one of polymethyl methacrylate (PMMA), polyvinyl carbazole (PVK), and poly[(9,9-dioctylfluorenyl-2,7-diyl)-co-(4,4'-(N-(4-sec-butylphenyl))diphenylamine)] (TFB).
8. The light-emitting element according to claim 1, wherein a band gap of the hole tunneling insulating layer is 3 eV or greater.
9. The light-emitting element according to claim 1, wherein the electron transport layer includes zinc oxide or titanium oxide.
10. The light-emitting element according to claim 1, wherein the electron transport layer includes magnesium zinc oxide.
11. The light-emitting element according to claim 9, wherein the electron transport layer is formed of nanoparticles.
12. A display device comprising the light-emitting element according to claim 1.
13. The display device according to claim 12, further comprising:
a plurality of light-emitting elements, including the light-emitting element, wherein
the plurality of light-emitting elements includes a first light-emitting element, a second light-emitting element, and a third light-emitting element,
an emission peak wavelength of the first light-emitting element is longer than an emission peak wavelength of the second light-emitting element, and
the emission peak wavelength of the second light-emitting element is longer than an emission peak wavelength of the third light-emitting element.
14. The display device according to claim 13,
wherein the first light-emitting element includes a first light-emitting layer as the light-emitting layer and a first hole tunneling insulating layer as the hole tunneling insulating layer,
the second light-emitting element includes a second light-emitting layer as the light-emitting layer and a second hole tunneling insulating layer as the hole tunneling insulating layer,
the third light-emitting element includes a third light-emitting layer as the light-emitting layer and a third hole tunneling insulating layer as the hole tunneling insulating layer,
the first hole tunneling insulating layer, the second hole tunneling insulating layer, and the third hole tunneling insulating layer are formed of an identical material,
electron affinity values of the first hole tunneling insulating layer, the second hole tunneling insulating layer, and the third hole tunneling insulating layer are smaller than a smallest value of an electron affinity value of the first light-emitting layer, an electron affinity value of the second light-emitting layer, and an electron affinity value of the third light-emitting layer by 0.5 eV or greater, and ionization potential values of the first hole tunneling insulating layer, the second hole tunneling insulating layer, and the third hole tunneling insulating layer are larger than a value obtained by subtracting 0.5 eV from a greatest value of an ionization potential value of the first light-emitting layer, an ionization potential value of the second light-emitting layer, and an ionization potential value of the third light-emitting layer.

15. The display device according to claim 13,
wherein the first light-emitting element includes a first light-emitting layer as the light-emitting layer and a first hole tunneling insulating layer as the hole tunneling insulating layer,
the second light-emitting element includes a second light-emitting layer as the light-emitting layer and a second hole tunneling insulating layer as the hole tunneling insulating layer,
the third light-emitting element includes a third light-emitting layer as the light-emitting layer and a third hole tunneling insulating layer as the hole tunneling insulating layer,
the first hole tunneling insulating layer, the second hole tunneling insulating layer, and the third hole tunneling insulating layer are formed of different materials,
an electron affinity value of the first hole tunneling insulating layer is smaller than an electron affinity value of the first light-emitting layer by 0.5 eV or greater,
an electron affinity value of the second hole tunneling insulating layer is smaller than an electron affinity value of the second light-emitting layer by 0.5 eV or greater,
an electron affinity value of the third hole tunneling insulating layer is smaller than an electron affinity value of the third light-emitting layer by 0.5 eV or greater,
an ionization potential value of the first hole tunneling insulating layer is greater than a value obtained by subtracting 0.5 eV from an ionization potential value of the first light-emitting layer,
an ionization potential value of the second hole tunneling insulating layer is greater than a value obtained by subtracting 0.5 eV from an ionization potential value of the second light-emitting layer, and
an ionization potential value of the third hole tunneling insulating layer is greater than a value obtained by subtracting 0.5 eV from an ionization potential value of the third light-emitting layer.

16. The display device according to claim 15,
wherein the electron affinity value of the third hole tunneling insulating layer is greater than the electron affinity value of the second hole tunneling insulating layer, and
the electron affinity value of the second hole tunneling insulating layer is greater than the electron affinity value of the first hole tunneling insulating layer.

17. The display device according to claim 15,
wherein the first hole tunneling insulating layer includes any one of silicon oxynitride, silicon oxide, and aluminum oxide.

18. The display device according to claim 15,
wherein the second hole tunneling insulating layer includes any one of aluminum oxide and polyvinyl carbazole (PVK).

19. The display device according to claim 15,
wherein the third hole tunneling insulating layer includes any one of silicon nitride, polyvinyl carbazole (PVK), and polymethyl methacrylate (PMMA).

20. The display device according to claim 14,
wherein the identical material includes any one of silicon oxide, aluminum oxide, silicon nitride, polyvinyl carbazole (PVK), and polymethyl methacrylate (PMMA).

21. The display device according to claim 14,
wherein a film thickness of the first hole tunneling insulating layer is greater than a film thickness of the second hole tunneling insulating layer, and
the film thickness of the second hole tunneling insulating layer is greater than a film thickness of the third hole tunneling insulating layer.

22. The display device according to claim 14,
wherein the first light-emitting element further includes a first electron transport layer as the electron transport layer,
the second light-emitting element further includes a second electron transport layer as the electron transport layer,
the third light-emitting element further includes a third electron transport layer as the electron transport layer,
an electron affinity value of the first electron transport layer is greater than the electron affinity value of the first light-emitting layer by of 0.5 eV or less,
an electron affinity value of the second electron transport layer is greater than the electron affinity value of the second light-emitting layer by 0.5 eV or less, and
an electron affinity value of the third electron transport layer is greater than the electron affinity value of the third light-emitting layer by 0.5 eV or less.

23. The display device according to claim 22,
wherein the electron affinity value of the first electron transport layer is greater than the electron affinity value of the second electron transport layer, and
the electron affinity value of the second electron transport layer is greater than the electron affinity value of the third electron transport layer.

24. The display device according to claim 13,
wherein the first light-emitting element is a light-emitting element configured to emit red light,
the second light-emitting element is a light-emitting element configured to emit green light, and
the third light-emitting element is a light-emitting element configured to emit blue light.

25. A light-emitting element provided with
an anode,
a light-emitting layer including quantum dots, and
a cathode, the light-emitting element comprising:
an electron transport layer provided between the cathode and the light-emitting layer and in contact with the cathode and the light-emitting layer; and
a hole tunneling insulating layer provided between the anode and the light-emitting layer and in contact with the anode and the light-emitting layer, wherein
the electron transport layer includes magnesium zinc oxide, and
the electron transport layer is formed of nanoparticles.

* * * * *